United States Patent
Lee

(10) Patent No.: US 9,391,162 B2
(45) Date of Patent: Jul. 12, 2016

(54) TUNNEL MOSFET WITH FERROELECTRIC GATE STACK

(71) Applicants: Taiwan Semiconductor Manufacturing Company, Ltd., Hsin-Chu (TW); National Taiwan University, Taipei (TW)

(72) Inventor: Min-Hung Lee, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 33 days.

(21) Appl. No.: 14/245,745

(22) Filed: Apr. 4, 2014

(65) Prior Publication Data

US 2015/0287802 A1    Oct. 8, 2015

(51) Int. Cl.
| | | |
|---|---|---|
| *H01L 31/0328* | (2006.01) |
| *H01L 29/861* | (2006.01) |
| *H01L 29/76* | (2006.01) |
| *H01L 29/66* | (2006.01) |
| *H01L 29/51* | (2006.01) |
| *H01L 21/02* | (2006.01) |
| *H01L 21/28* | (2006.01) |
| *H01L 29/739* | (2006.01) |
| *H01L 29/78* | (2006.01) |
| *H01L 29/10* | (2006.01) |

(52) U.S. Cl.
CPC .... *H01L 29/66356* (2013.01); *H01L 21/02186* (2013.01); *H01L 21/02194* (2013.01); *H01L 21/02266* (2013.01); *H01L 21/28176* (2013.01); *H01L 21/28291* (2013.01); *H01L 29/516* (2013.01); *H01L 29/6684* (2013.01); *H01L 29/66431* (2013.01); *H01L 29/66977* (2013.01); *H01L 29/7391* (2013.01); *H01L 29/78391* (2014.09); *H01L 29/1054* (2013.01)

(58) Field of Classification Search
CPC ............ H01L 29/516; H01L 21/02194; H01L 29/66977; H01L 21/28194; H01L 21/02186; H01L 29/6684; H01L 21/28176; H01L 21/02266; H01L 29/7391; H01L 29/66356; H01L 29/66431
USPC .................. 257/192, 288, 105, 295
See application file for complete search history.

(56) References Cited

U.S. PATENT DOCUMENTS

| | | | | |
|---|---|---|---|---|
| 7,947,557 | B2* | 5/2011 | Chen | H01L 29/165 257/192 |
| 8,053,785 | B2* | 11/2011 | Cho | B82Y 10/00 257/328 |
| 8,362,604 | B2 | 1/2013 | Ionescu | |
| 2005/0011857 | A1* | 1/2005 | Borland | H01G 4/1218 216/13 |
| 2006/0284164 | A1* | 12/2006 | Lee | H01L 29/1054 257/19 |
| 2008/0251836 | A1* | 10/2008 | Park | H01L 29/66833 257/324 |
| 2012/0012918 | A1* | 1/2012 | Zhu | H01L 29/7881 257/316 |
| 2012/0223387 | A1* | 9/2012 | Cui | H01L 29/7391 257/366 |
| 2012/0327700 | A1* | 12/2012 | Li | G11C 17/16 365/104 |
| 2015/0263268 | A1* | 9/2015 | Fox | H01L 43/08 257/421 |

OTHER PUBLICATIONS

Khan, Asif et al., "Ferroelectric Negative Capacitance MOSFET: Capacitance Tuning & Antiferroelectric Operation," Electron Devices Meeting (IEDM) IEEE International, Dec. 5-7, 2011, pp. 11.3.1-11.3.4.

Villalon, A. et al., "Strained Tunnel FETs with record Ion: First demonstration of ETSOI TFETs with SiGe channel and RSD," Symposium on VLSI Technology Digest of Technical Papers, Jun. 12-14, 2012, pp. 49-50.

* cited by examiner

*Primary Examiner* — Shouxiang Hu
(74) *Attorney, Agent, or Firm* — Slater Matsil, LLP

(57) ABSTRACT

A Tunnel Field-Effect Transistor (TFET) includes a source region in a semiconductor substrate, and a drain region in the semiconductor substrate. The source region and the drain region are of opposite conductivity types. The TFET further includes a gate stack over the semiconductor substrate, with the source region and the drain region extending to opposite sides of the gate stack. The gate stack includes a gate dielectric over the semiconductor substrate, and a ferroelectric layer over the gate dielectric.

15 Claims, 5 Drawing Sheets

TUNNEL MOSFET WITH FERROELECTRIC GATE STACK

BACKGROUND

Metal-Oxide-Semiconductor (MOS) technology has been used widely. A MOS device can work in three regions including a linear region, a saturation region, and a sub-threshold region, depending on the gate voltage Vg and the source-drain voltage Vds. The sub-threshold region is a region in which gate voltage Vg is lower than the threshold voltage Vt. A parameter known as Sub-threshold Swing (SS) represents the easiness of switching the transistor current off and on, and is a factor in determining the speed of a MOS device. The sub-threshold swing can be expressed as a function of m*kT/q, where m is a parameter related to capacitance, k is the Boltzman constant, T is the absolute temperature, and q is the magnitude of the electrical charge on an electron.

Previous studies have revealed that the sub-threshold swing of a typical MOS device has a limit of about 60 mV/decade at room temperature, which in turn sets a limit for further scaling of operational voltage VDD and threshold voltage Vt. This limitation is due to the diffusion transport mechanism of carriers. For this reason, existing MOS devices typically cannot switch faster than 60 mV/decade at room temperatures. With such a limit, faster switching at low operational voltages is difficult to achieve. To solve the above-discussed problem, Tunnel Field-Effect Transistors (TFETs) have been explored. In a TFET, electron injection is governed by the band-to-band tunneling from the valence band of the source to the conduction band of the channel. Since the current mechanism is determined by tunneling, the SS can be very low at the initial stage the TFET is turned on. When the voltage increases, however, the SS quickly increases, and the current no longer increases fast enough. This posts a problem for improving TFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
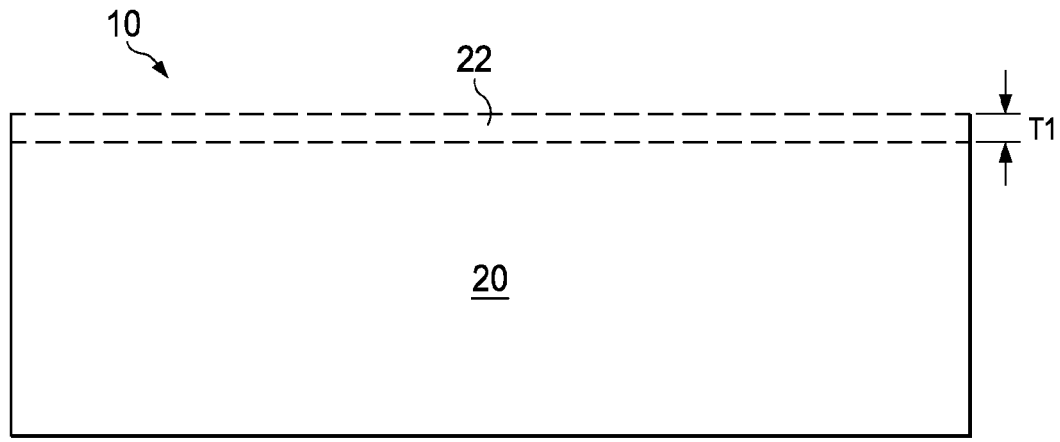
FIGS. 1 through 8 illustrate the cross-sectional views of intermediate stages in the formation of a Tunnel Field-Effect Transistor (TFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Tunnel Field-Effect Transistor (TFET) and the method of forming the same are provided in accordance with various exemplary embodiments. The intermediate stages of forming the TFET are illustrated. The variations of the embodiments are discussed. Throughout the various views and illustrative embodiments, like reference numbers are used to designate like elements.

FIGS. 1 through 8 illustrate the cross-sectional views of intermediate stages in the formation of a TFET in accordance with some embodiments. Referring to FIG. 1, wafer 10, which includes substrate 20, is provided. Substrate 20 includes a semiconductor substrate. In some exemplary embodiments, substrate 20 is formed of bulk crystalline silicon. In alternative embodiments, substrate 20 comprises silicon germanium, silicon carbon, or other semiconductor materials. Substrate 20 may also have a Silicon-On-Insulator (SOI) structure in some embodiments.

In some embodiments, low-bandgap semiconductor layer 22 is formed on the top surface of substrate 20. In alternative embodiments, low-bandgap semiconductor layer 22 is not formed. Low-bandgap semiconductor layer 22 may be epitaxially grown, and hence is sometimes referred to epitaxy semiconductor layer 22. Low-bandgap semiconductor layer 22 has a bandgap lower than the bandgap of the underlying substrate 20. The bandgap difference between the bandgap of substrate 20 and low-bandgap semiconductor layer 22 may be greater than about 0.2 eV in some exemplary embodiments. For example, low-bandgap semiconductor layer 22 may include pure or substantially pure germanium (with a germanium atomic percentage higher than about 90 percent, for example). In alternative embodiments, low-bandgap semiconductor layer 22 comprises silicon germanium. Thickness T1 of low-bandgap semiconductor layer 22 may be smaller than the stress-relaxation thickness of low-bandgap semiconductor layer 22. For example, thickness T1 may be smaller than about 100 Å.

Figure 2:
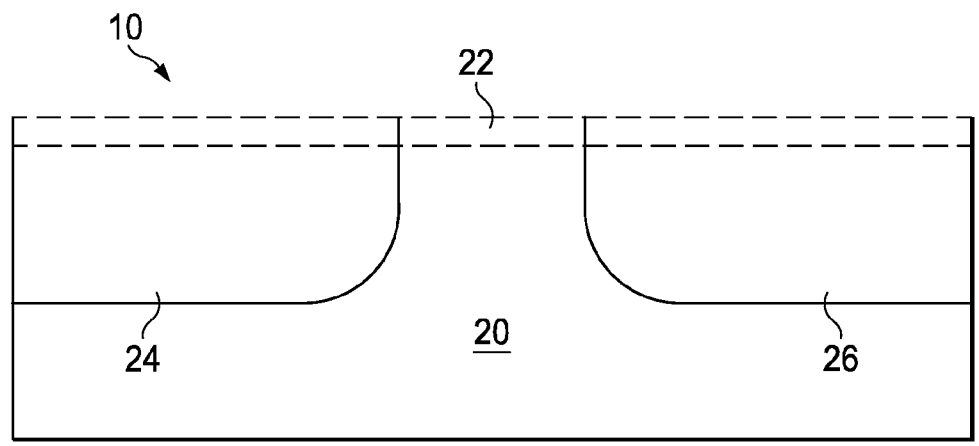

FIG. 2 illustrates the formation of source region 24 and drain region 26. In some embodiments, the formation of source region 24 includes applying, exposing, and developing a first photo resist layer (not shown). The desirable region for forming source region 24 is exposed through the first photo resist layer. An implantation is then performed to implant an n-type impurity, such as phosphorous, arsenic, antimony, or combinations thereof, into substrate 20 to form source region 24. Source region 24 is also referred to as a heavily doped n-type (N+) region. Throughout the description, the term "heavily doped" means an impurity concentration higher about $10^{19}/cm^3$, and the respective region may be marked using a "p+" or an "n+" sign. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments. The first photo resist layer is then removed.

The formation of drain region 26 includes applying, exposing, and developing a second photo resist layer (not shown). The desirable region for forming drain region 26 is exposed through the second photo resist layer. An implantation is then performed to implant a p-type impurity, such as boron, indium, or combinations thereof, into substrate 20 to form drain region 26. Drain region 26 is also referred to as a heavily doped p-type (P+) region. The second photo resist layer is then removed. A source/drain activation may then be used to activate the implanted impurity in source region 24 and drain region 26. In the embodiments of the present application, source/drain extension regions are not formed in order to maintain the band-to-band tunneling effect of the resulting TFET.

Figure 3:
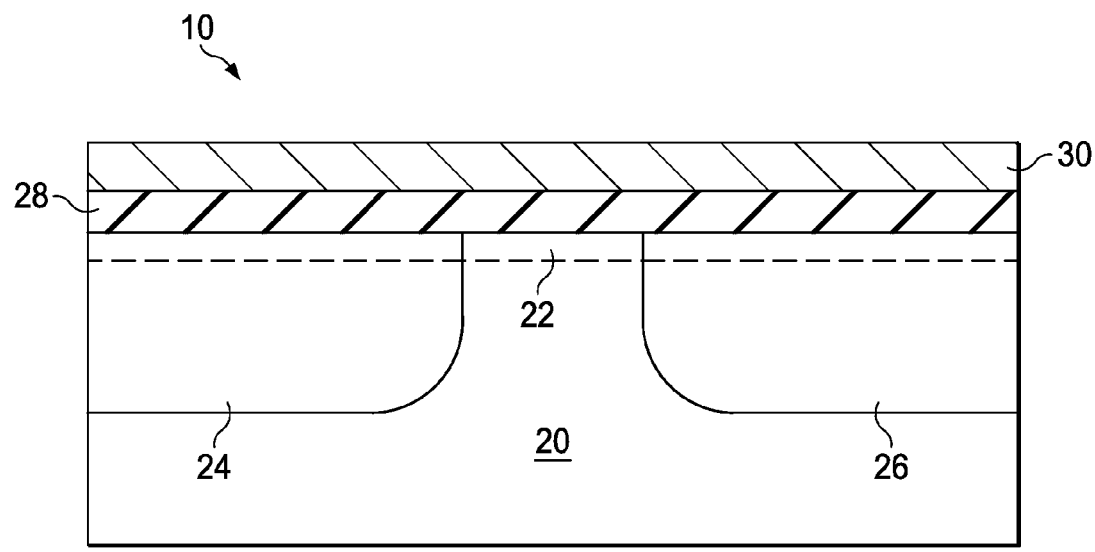

Referring to FIG. 3, high-k dielectric layer 28 is formed over substrate 20 (and epitaxy semiconductor layer 22, if formed). High-k dielectric layer 28 has a dielectric constant (k-value) higher than 3.9. In some exemplary embodiments, the k-value of high-k dielectric layer 28 is higher than about 7, and may be higher than about 20. The exemplary materials of high-k dielectric layer 28 include $HfO_2$, $Al_2O_3$, $HfSiO_y$, $La_2O_3$, or the like. High-k dielectric layer 28 may be formed using Atomic Layer Deposition (ALD), Plasma Enhance Chemical Vapor Deposition (PECVD), or the like.

Again referring to FIG. 3, diffusion barrier layer 30 is formed over high-k dielectric layer 28. Diffusion barrier layer 30 is a metal-containing layer in some embodiments. Furthermore, diffusion barrier layer 30 may have a low resistivity much lower than the resistivity of the underlying high-k dielectric layer 28. For example, diffusion barrier layer 30 may be a conductive layer, although its conductivity is relatively low. Exemplary materials for forming diffusion barrier layer 30 include TiN, TaN, tungsten (W), platinum (Pt), or the like. In some embodiments, diffusion barrier layer 30 is formed using Physical Vapor Deposition (PVD).

Figure 4:
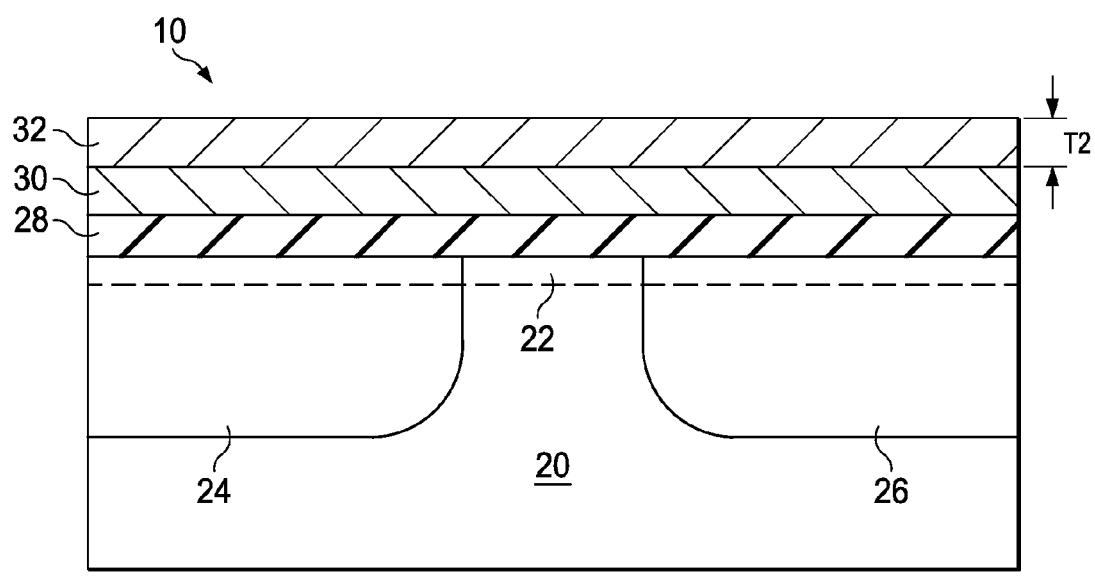

Diffusion barrier layer 30 has a high melting temperature higher than the annealing temperature of the subsequently formed ferroelectric layer 32 (FIG. 4). Accordingly, in subsequent annealing processes, diffusion barrier layer 30 functions to prevent the elements in high-k dielectric layer 28 and ferroelectric layer 32 (FIG. 4) from diffusing into each other.

FIG. 4 illustrates the formation of ferroelectric layer 32. It is appreciated that the ferroelectric layer 32, as-deposited without being annealed, may, or may not, have the ferroelectric property. However, it is still referred to as a ferroelectric layer since the ferroelectric property will be achieved in subsequent processes. Ferroelectric layer 32 includes electric dipoles. The thickness T2 of ferroelectric layer 32 may be smaller than about 30 nm, and may be in the range between about 1 nm and about 30 nm. The exemplary materials of ferroelectric layer 32 include $HfO_2$, $HfSiO_x$, $HfZrOx$, $Al_2O_3$, $TiO_2$, $LaO_x$, BaSrTiOx (BST), $PbZrTiO_x$ (PZT), or the like, wherein value x is greater than zero and smaller than 1. Ferroelectric layer 32 may be formed using PVD, which may be formed at a wafer temperature between about 25° C. and about 400° C.

It is appreciated that although some of the candidate materials (such as $HfO_2$, $HfSiO_x$, $HfZrOx$, $Al_2O_3$, $TiO_2$, and $LaO_x$) of ferroelectric layer 32 include the same elements as some high-k dielectric materials, ferroelectric layer 32 has different properties than high-k dielectric materials. For example, ferroelectric layer 32 may have a resistivity lower than the respective high-k dielectric material that contains the same type of elements. Ferroelectric layer 32 may still be a dielectric layer, except that if it is used as gate dielectric, the leakage current will be high. Accordingly, ferroelectric layer 32 may not be suitable to be used as a gate dielectric even if it may also include the same elements as some known high-k dielectric materials.

In addition, the atomic percentages in ferroelectric layer 32 may be different from the respective high-k dielectric materials that include the same elements. Alternatively stated, the composition (reflecting the type of elements and the percentages of the elements) of ferroelectric layer 32 may be different from a high-k dielectric material even if they include the same elements. For example, $HfSiO_x$, when used as a high-k material, has a relatively low atomic percentage ratio $P_{Hf}/P_{Si}$ (which may be smaller than about 10, wherein $P_{Hf}$ is the atomic percentage of hafnium, and $P_{Si}$, is the atomic percentage of silicon. When used to form ferroelectric layer 32, however, the HfSiOx is Hf rich and Si poor. For example, the atomic percentage ratio $P_{Hf}/P_{Si}$ in the respective ferroelectric $HfSiO_x$ may be increased to greater than about 10, and may be in the range between about 10 and about 100.

In addition, whether layer 32 will have the ferroelectric property or not is affected by various factors including, and not limited to, the elements contained, the percentage of the elements, and the phase of the resulting crystal structure. The phase is also affected by the deposition process conditions and post-treatment conditions for forming layer 32. Accordingly, even if a material has the same elements and same percentages of the elements as ferroelectric layer 32, this material is not necessarily a ferroelectric material. For example, the formation conditions and the subsequent annealing process can affect whether the ferroelectric property can be achieved or not, as will be discussed in subsequent discussion.

In some embodiments, ferroelectric layer 32 has a crystalline structure, while high-k dielectric layer 28 has an amorphous structure. In these embodiments, ferroelectric layer 32 and high-k dielectric layer 28 may have a same composition (including same type of elements and same atomic percentages of the elements) or different compositions.

Figure 5:
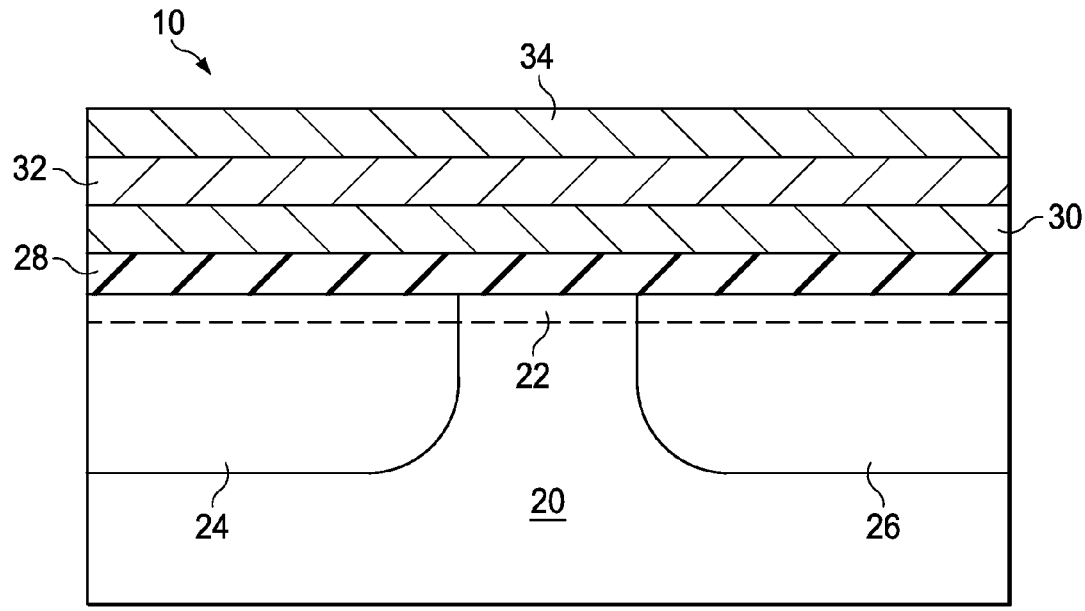

As shown in FIG. 5, top electrode 34 is formed over ferroelectric layer 32. Top electrode 34 may include a metallic material such as silver, aluminum, tungsten, nickel, or alloys thereof. Next, an annealing is performed. The annealing may result in layer 32 to have the ferroelectric property if ferroelectric layer 32 has not had the ferroelectric property yet. The annealing may be performed using thermal annealing, microwave annealing, laser annealing, or other applicable methods. The annealing duration may be shorter than about 1,000 seconds. The annealing temperature may be higher than about 400° C., and may be as high as about 1,000° C. or higher. The annealing duration and the annealing temperature are related to the composition of ferroelectric layer 32. For example, when PZT is used, the annealing temperature may be higher than about 200° C., or in the range between about 400° C. and about 600° C., and the annealing duration may be shorter than about 300 seconds.

In order to achieve the ferroelectric property, it is desirable to have top electrode 34 capping ferroelectric layer 32 when the annealing is performed. Otherwise, it is very difficult (if it can be done at all) to achieve proper crystalline phase for ferroelectric layer 32, and the ferroelectric property may not be achieved. Accordingly, top electrode 34 and diffusion barrier layer 30 have the melting temperatures higher than the annealing temperature, so that they don't melt in the annealing. Diffusion barrier layer 30 separates high-k dielectric layer 28 and ferroelectric layer 32 from inter-diffusing, so that their properties may remain after the annealing. Otherwise, due to the inter-diffusing, un-predictable property change may occur in one or both of high-k dielectric layer 28 and ferroelectric layer 32. For example, if the inter-diffusion occurs, the ferroelectric property of ferroelectric layer 32 may be lost. Similarly, high-k dielectric layer 28 also has the melting temperatures higher than the annealing temperature.

Figure 6:
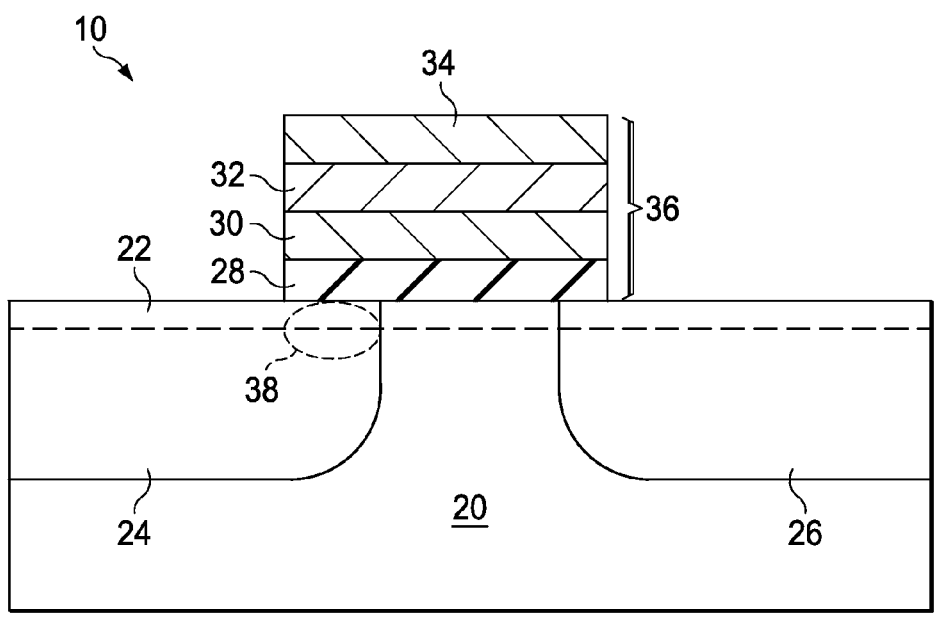

Referring to FIG. 6, high-k dielectric layer 28, diffusion barrier layer 30, ferroelectric layer 32, and top gate layer 34 are patterned to form gate stack 36, which include high-k dielectric 28, diffusion barrier 30, ferroelectric 32, and top gate 34. In some embodiments, gate stack 36 overlaps a part of source region 24, so that Band-To-Band-Tunneling (BTBT) region 38 is formed in substrate 20 and epitaxy semiconductor layer 22. BTBT region 38 is overlapped by gate stack 36. In alternative embodiments, the edge of source region 24 is aligned to a respective edge of gate stack 36. In these embodiments, source region 24, through the diffusion in subsequent thermal process, will also be diffused to directly under gate stack 36, and BTBT region 38 will also be formed. In these embodiments, the steps for forming source region 24 and drain region 26 may be performed after the patterning for forming gate stack 36.

Figure 7:
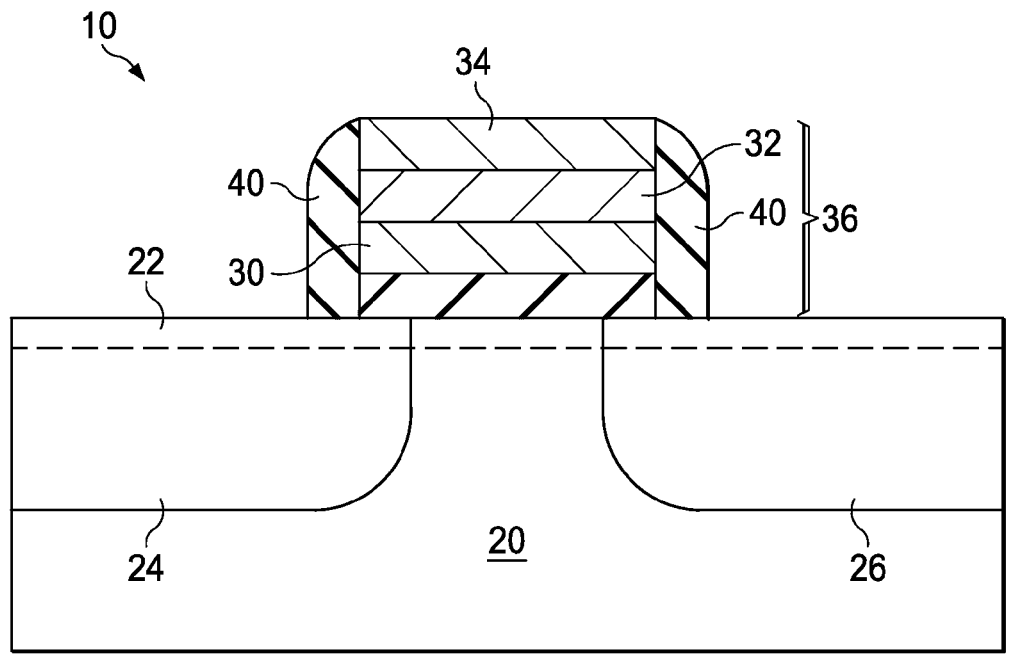

Next, as shown in FIG. 7, gate spacers 40 are formed on the sidewalls of gate stack 36. In some embodiments, gate spacers 40 are formed of silicon oxide. In alternative embodiments, gate spacers 40 are formed of silicon nitride. In yet alternative embodiments, gate spacers 40 have a composite structure. For example, each of gate spacers 40 may include a silicon oxide layer having an L-shape, and a silicon nitride layer overlapping the horizontal leg of the L-shape.

Figure 8:
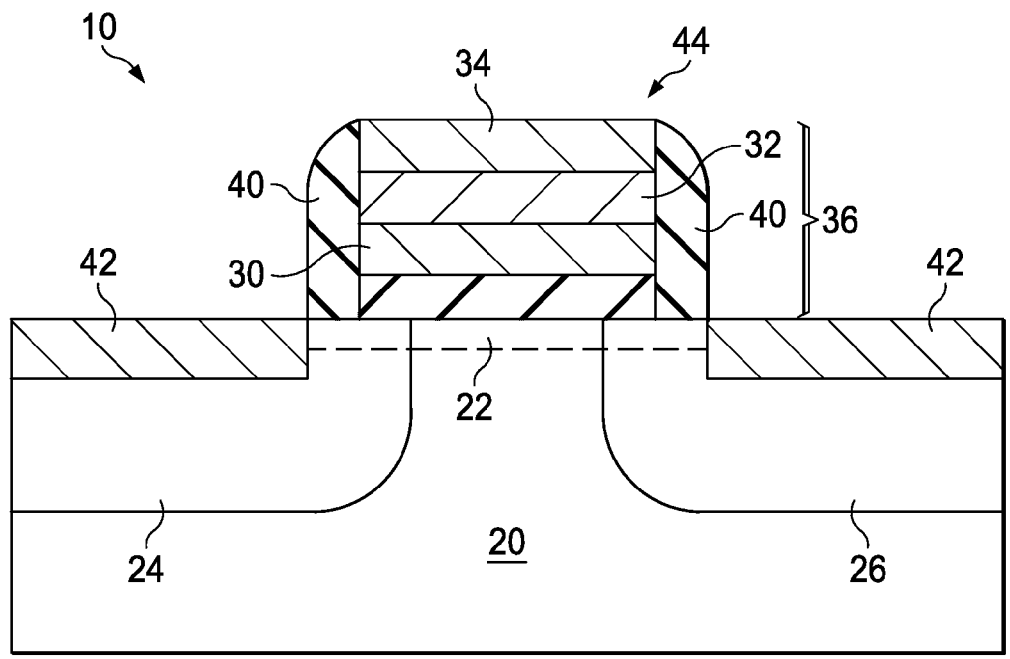

FIG. 8 illustrates the formation of silicide regions 42. In some embodiments, the silicidation process includes forming a metal layer (not shown) over the structure shown in FIG. 7, performing an annealing to react the metal layer with the exposed surfaces of source region 24 and drain region 26 and to form silicide regions 42, and removing un-reacted portions of the metal layer. TFET 44 is thus formed.

Figure 9:
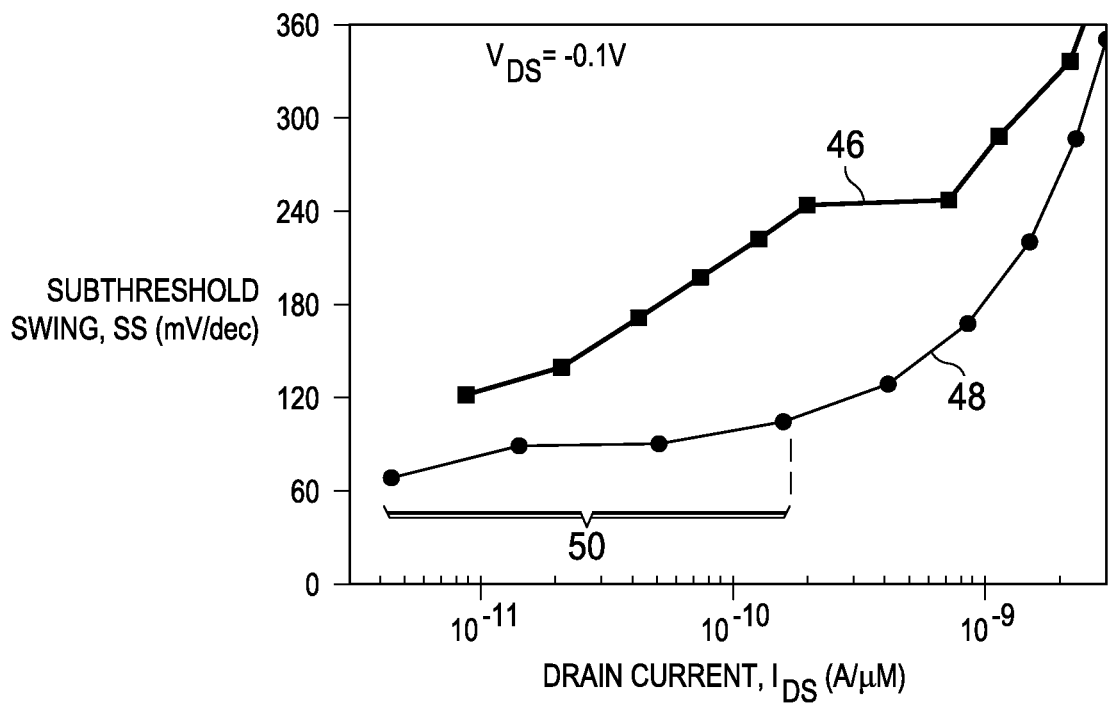
FIG. 9 illustrates the experimental results comparing the TFETs having a TFET in accordance with the embodiments of the present disclosure and a conventional TFET.

FIG. 9 illustrates the experimental results comparing the performance of a TFET having the structure shown in FIG. 8 to the performance of a conventional TFET. The Sub-threshold Swing (SS) values are illustrated as a function of drain current $I_{Ds}$. Line 48 is obtained from a TFET having the structure shown in FIG. 8. Line 46 is obtained from a conventional TFET having a structure similar to what is shown in FIG. 8, except that the ferroelectric layer 32 is not formed. As shown by line 46, in the conventional TFET, the SS values rise quickly with the increase in the drain current. This means that with the increase of the drain current, the increasing rate of the drain current is quickly reduced, and the turning on speed of the TFET is reduced. As a comparison, line 48 indicates that (as shown by points 50) with the increase of drain current from about $4 \times 10^{-12}$ A/μm to about $2 \times 10^{-10}$ A/μm, the increase in SS values is slow. This means that in the entire range between $4 \times 10^{-12}$ A/μm to about $2 \times 10^{-10}$ A/μm, the increasing rate of the drain current remains to be high. In addition, comparing lines 46 and 48, it is found that the initial SS value of line 48 is much lower than the initial SS value of line 46, indicating the initial increasing rate of the TFET in accordance with the embodiments of the present application is higher than convention TFET without the ferroelectric layer.

Figure 10:
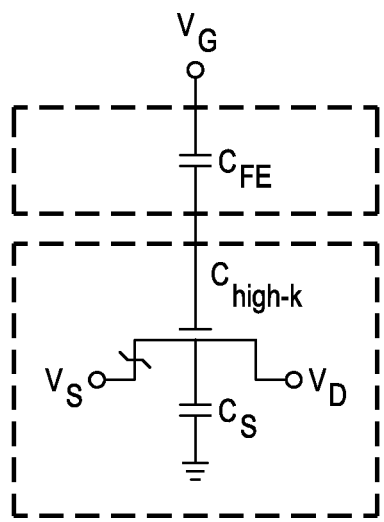
FIG. 10 illustrates an equivalent circuit diagram of a TFET in accordance with some embodiments.

FIG. 10 illustrates portions of the equivalent circuit diagram of the TFET 44 as shown in FIG. 8. $V_g$, $V_s$, and $V_D$ represent the voltages on top electrode 34, source region 24, and drain region 26 (FIG. 8), respectively. Capacitors $C_{FE}$, $C_{High-k}$, and $C_s$ are the equivalent capacitors of ferroelectric layer 32, high-k dielectric layer 28, and substrate 20. The SS value of TFET 44 may be represented as:

$$SS = (\partial V_g)/(\partial (\log_{10} I_d)) \qquad [\text{Eq. 1}]$$
$$= ((\partial V_g)/(\partial \Psi_S)) * ((\partial (\Psi_S)/\partial (\log_{10} I_d))$$
$$= (1 + C_s/C_{ins}) * ((\partial (\Psi_S)/\partial (\log_{10} I_d))$$

Wherein $\Psi_S$ is the surface potential of substrate 20 (FIG. 8), and Id is the drain current. The value $(1+C_s/C_{ins})$ is affected by the ferroelectric layer 32. The value $(\partial (\Psi_S)/\partial (\log_{10} I_d))$ is affected by transport mechanism. By introducing the ferroelectric material into the gate stack of the TFET, equivalent capacitance $C_{ins}$ has a negative value, which means that $(1+C_s/C_{ins})$ is smaller than 1. Therefore, the SS value of the TFET is reduced due to the existence of $C_{ins}$ (and ferroelectric layer 32).

The embodiments of the present disclosure have some advantageous features. By adopting the ferroelectric layer in the gate stack, the SS value of the resulting TFET is reduced. In addition, the range in which the SS value has low values (before the SS value increases dramatically) is enlarged, sometimes to three to four orders of current increase. In conventional TFETs, however, the range in which the SS value has very low values before it increases is only about one order of current increase.

In accordance with some embodiments of the present disclosure, a TFET includes a source region in a semiconductor substrate, and a drain region in the semiconductor substrate. The source region and the drain region are of opposite conductivity types. The TFET further includes a gate stack over the semiconductor substrate, with the source region and the drain region extending to opposite sides of the gate stack. The gate stack includes a gate dielectric over the semiconductor substrate, and a ferroelectric layer over the gate dielectric.

In accordance with alternative embodiments of the present disclosure, a TFET includes a semiconductor substrate, a source region in the semiconductor substrate, and a drain region in the semiconductor substrate. The source region and the drain region are of opposite conductivity types. The TFET further includes a gate stack over the semiconductor substrate. The gate stack includes a high-k gate dielectric over the semiconductor substrate, and a diffusion barrier over the high-k gate dielectric. The diffusion barrier is a conductive layer. The gate stack further includes a ferroelectric layer over the diffusion barrier, and the ferroelectric layer includes a dielectric material. The gate stack further includes a conductive electrode over the ferroelectric layer.

In accordance with yet alternative embodiments of the present disclosure, a method includes forming a source region in a semiconductor substrate, forming a drain region in the semiconductor substrate, wherein the source region and the drain region are of opposite conductivity types. A gate stack is formed over the semiconductor substrate, with the source region and the drain region extending to opposite sides of the gate stack. The formation of the gate stack includes forming a high-k gate dielectric over the semiconductor substrate, forming a diffusion barrier over the high-k gate dielectric, wherein the diffusion barrier is a conductive layer, forming a ferroelectric layer over the diffusion barrier, wherein the ferroelectric layer includes a dielectric material, and forming a conductive electrode over the ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A Tunnel Field-Effect Transistor (TFET) comprising:
   a semiconductor substrate;
   a source region in the semiconductor substrate;
   a drain region in the semiconductor substrate, wherein the source region and the drain region are of opposite conductivity types; and
   a gate stack over the semiconductor substrate, with the source region and the drain region extending to opposite sides of the gate stack, wherein the gate stack comprises:
      a gate dielectric over the semiconductor substrate, wherein the gate dielectric comprises a high-k dielectric material; and
      a ferroelectric layer over the gate dielectric, wherein the gate dielectric and the ferroelectric layer have a same composition, and the gate dielectric has an amorphous structure, and the ferroelectric layer has a crystalline structure; and
   a diffusion barrier overlying the high-k dielectric material and underlying the ferroelectric layer.

2. The TFET of claim 1, wherein the diffusion barrier is a conductive layer.

3. The TFET of claim 1 further comprising a top electrode overlying and in contact with the ferroelectric layer.

4. The TFET of claim 1, wherein the ferroelectric layer comprises $HfO_2$, $HfSiO_x$, $HfZrO_x$, $Al_2O_3$, $TiO_2$, $LaO_x$, BaSrTiO$_x$ (BST), or PbZrTiO$_x$ (PZT).

5. The TFET of claim 1, wherein the semiconductor substrate comprises crystalline silicon, wherein the TFET further comprises an epitaxy semiconductor layer over the semiconductor substrate and overlapped by the gate stack, with the epitaxy semiconductor layer having a bandgap smaller than a bandgap of the semiconductor substrate.

6. A Tunnel Field-Effect Transistor (TFET) comprising:
   a semiconductor substrate;
   a source region in the semiconductor substrate;
   a drain region in the semiconductor substrate, wherein the source region and the drain region are of opposite conductivity types; and
   a gate stack over the semiconductor substrate, wherein the gate stack comprises:
      a high-k gate dielectric over the semiconductor substrate, wherein the high-k gate dielectric has an amorphous structure;
      a diffusion barrier over the high-k gate dielectric;
      a ferroelectric layer over the diffusion barrier, wherein the ferroelectric layer comprises a dielectric material having a crystalline structure, wherein the high-k gate dielectric and the ferroelectric layer comprise same types of elements, and have a same composition, and wherein a first resistivity of the high-k gate dielectric is higher than a second resistivity of the ferroelectric layer; and
      a conductive electrode over the ferroelectric layer.

7. The TFET of claim 6, wherein the ferroelectric layer comprises $HfO_2$, $HfSiO_x$, $HfZrO_x$, $Al_2O_3$, $TiO_2$, $LaO_x$, BaSrTiO$_x$ (BST), or PbZrTiO$_x$ (PZT).

8. The TFET of claim 6, wherein the high-k gate dielectric comprises $HfO_2$, $Al_2O_3$, $HfSiO_y$, $WZrO_x$, or $La_2O_3$.

9. The TFET of claim 6, wherein the semiconductor substrate comprises crystalline silicon, and wherein the TFET further comprises an epitaxy semiconductor layer over the semiconductor substrate and overlapped by the gate stack, with the epitaxy semiconductor layer having a bandgap smaller than a bandgap of the semiconductor substrate.

10. The TFET of claim 6, wherein the source region comprises a portion overlapped by the gate stack.

11. The TFET of claim 6, wherein the diffusion barrier is a conductive layer.

12. A Tunnel Field-Effect Transistor (TFET) comprising:
   a semiconductor substrate;
   a gate stack over the semiconductor substrate, wherein the gate stack comprises:
      a high-k gate dielectric over the semiconductor substrate, wherein the high-k gate dielectric has an amorphous structure;
      a ferroelectric layer over the high-k gate dielectric, wherein the ferroelectric layer comprises a dielectric material, with types of elements in the ferroelectric layer being same as types of elements in the high-k gate dielectric, and wherein the ferroelectric layer has a crystalline structure; and
      a conductive electrode over the ferroelectric layer; and
      a diffusion barrier between the high-k gate dielectric and the ferroelectric layer, wherein the diffusion barrier is a conductive layer.

13. The TFET of claim 12, wherein the high-k gate dielectric and the ferroelectric layer have a same composition.

14. The TFET of claim 12 further comprising:
   a source region in the semiconductor substrate; and
   a drain region in the semiconductor substrate, wherein the source region and the drain region are of opposite conductivity types.

15. The TFET of claim 12, wherein both the ferroelectric layer and the high-k gate dielectric comprise $HfO_2$, $HfSiO_x$, $HfZrO_x$, $Al_2O_3$, $TiO_2$, $LaO_x$, BaSrTiO$_x$ (BST), or PbZrTiO$_x$ (PZT).

* * * * *